(12) United States Patent
Hirayanagi

(10) Patent No.: US 6,909,490 B2
(45) Date of Patent: Jun. 21, 2005

(54) RETICLE CHAMBERS AND RETICLE CASSETTES PROVIDING TEMPERATURE CONTROL AND READY EXCHANGE OF RETICLES FOR EXPOSURE

(75) Inventor: Noriyuki Hirayanagi, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/313,663

(22) Filed: Dec. 6, 2002

(65) Prior Publication Data

US 2004/0109152 A1 Jun. 10, 2004

(30) Foreign Application Priority Data

Dec. 6, 2001 (JP) ........................................ 2001-372315

(51) Int. Cl.$^7$ ...................... G03B 27/52; G03B 27/42; G03B 27/62; B65G 49/07
(52) U.S. Cl. ............................ 355/30; 355/53; 355/75; 250/492.22; 414/939
(58) Field of Search ......................... 250/492.22, 492.2; 355/30, 53, 72, 75, 77; 414/935–941; 378/34

(56) References Cited

U.S. PATENT DOCUMENTS

| | | | | |
|---|---|---|---|---|
| 5,498,118 A | * | 3/1996 | Nakahara | ............... 414/416.03 |
| 5,559,584 A | | 9/1996 | Miyaji et al. | |
| 6,320,646 B1 | * | 11/2001 | Mouri | ........................ 355/53 |
| 6,342,941 B1 | * | 1/2002 | Nei et al. | ..................... 355/52 |
| 6,447,964 B2 | | 9/2002 | Okino et al. | |
| 6,473,157 B2 | * | 10/2002 | Nakahara | ..................... 355/53 |
| 6,829,038 B2 | | 12/2004 | Miwa | |
| 2001/0016302 A1 | | 8/2001 | Hirayanagi et al. | |
| 2001/0031407 A1 | | 10/2001 | Okino et al. | |
| 2002/0024645 A1 | * | 2/2002 | Nakano | ....................... 355/53 |

* cited by examiner

*Primary Examiner*—Alan Mathews
(74) *Attorney, Agent, or Firm*—Klarquist Sparkman, LLP

(57) ABSTRACT

For use in association with microlithography systems, reticle chambers and reticle cassettes are disclosed that provide ready access to and exchange of reticles for exposure as well as temperature control of the reticles. In an embodiment a vacuum reticle library is provided in a reticle-storage chamber. The vacuum reticle library includes a rack comprising multiple shelves for holding respective reticles at different respective elevations. One or more shelves comprises a fluid conduit through which is circulated a temperature-controlled fluid. By adjusting and controlling the temperature of the fluid (e.g., water) circulated to each shelf, the temperature of the respective reticles held on the shelves can be controlled and adjusted quickly. Similarly, an atmospheric-pressure reticle library can be provided in an atmospheric-pressure chamber containing a rack of multiple shelves on which respective reticle cassettes (containing reticles) can be stored. The cassettes and reticles can be identified by a bar code or the like that is read to avoid mixups during reticle transport and exchange.

26 Claims, 3 Drawing Sheets

RETICLE CHAMBERS AND RETICLE CASSETTES PROVIDING TEMPERATURE CONTROL AND READY EXCHANGE OF RETICLES FOR EXPOSURE

FIELD

This disclosure pertains to microlithography, which is a key technique used in the manufacture of microelectronic and other micro-devices such as semiconductor integrated circuits, displays, etc. More specifically, the disclosure pertains to microlithography in which a pattern, defined on a reticle or mask (generally termed "reticle" herein) is transfer-exposed by an energy beam from the reticle to a suitable substrate that is "sensitive" to the exposure in a way resulting in imprinting of an image of the pattern on the surface of the substrate. Even more specifically, the disclosure pertains to microlithography performed in a subatmospheric ("vacuum") environment such as in a temperature-controlled vacuum chamber to and from which reticles are exchanged for exposure.

BACKGROUND

FIG. 5 schematically depicts the structure of a conventional microlithography system employing an electron beam as a lithographic energy beam. A main unit 100 of the system includes an illumination-optical-system (IOS) lens column 101, a reticle chamber 103, a projection-optical-system (POS) lens column 105, and a substrate chamber 107. The IOS lens column 101 is a vacuum chamber that contains an electron gun (serving as the electron-beam source) and the illumination-optical system itself, including beam-shaping aperture, condenser lens(es), beam deflector(s), etc. (not detailed, but well understood in the art). The POS lens column 105 also is a vacuum chamber that is connected downstream of the IOS lens column 101 with the reticle chamber 103 therebetween. The POS lens column 105 contains the projection-optical system, comprising projection lens(es), beam deflector(s), correction coil(s), etc. (not shown, but well-understood in the art). Inside the reticle chamber 103 (also a vacuum chamber) is a reticle stage 104 that supports and positions the reticle for exposure. Inside the substrate chamber 107 (also a vacuum chamber but located downstream of the POS lens column 105) is a substrate stage 108 that supports and positions the substrate (e.g., resist-coated semiconductor wafer) for exposure.

A reticle load-lock chamber 111 is connected to the reticle chamber 103 at the right in the figure. A vacuum-side transport robot 113 is provided inside the reticle load-lock chamber 111 as a reticle-exchange means. An atmosphere-side transport robot 115 and reticle stand 119 are situated at the right of the reticle load-lock chamber 111 in the figure. A reticle cassette 117 is placed on the reticle stand 119. A reticle 120, defining a pattern for use in microlithography, is situated inside the reticle cassette 117.

When exchanging reticles, the reticle 120 inside the reticle cassette 117 is placed manually on the reticle stand 119 by an operator. Upon receiving a reticle-load command from the operator, the atmosphere-side transport robot 115 removes the reticle 120 from the reticle cassette 117 and transports the reticle to inside the reticle load-lock chamber 111. Then, the reticle load-lock chamber 111 is exhausted to a suitable vacuum level by a vacuum pump (not shown, but well-understood in the art). When the required vacuum level is reached inside the reticle load-lock chamber 111, the vacuum-side transport robot 113 transports the reticle 120 from the reticle load-lock chamber 111 to inside the reticle chamber 103 and places the reticle on the reticle stage 104. After the reticle 120 is placed on the reticle stage 104, final reticle positioning and alignment are performed in preparation for exposure.

The conventional device and operational sequence described above are subject to the following problems:

(1) When exchanging reticles, the operator must place the reticle 120 inside the reticle cassette 117 on the reticle stand 119 each time. Hence, whenever microlithographic exposures are being performed using multiple different reticles, this manual operation consumes substantial time and effort.

(2) When transporting a reticle 120 from inside the reticle cassette 117 to inside the reticle load-lock chamber 111, the reticle moves from atmospheric pressure to a reduced-pressure atmosphere. This change is accompanied by a temperature change of the reticle. The reticle also experiences a significant temperature change when being used for exposure. These changes require substantial time for stabilization.

SUMMARY

In view of the problems associated with conventional methods and apparatus, as summarized above, the present invention provides, inter alia, microlithographic-exposure methods and systems that achieve easy exchange of reticles while providing reticle-temperature control as required for rapid reticle exchange.

According to one aspect of the invention, microlithography systems are provided for transfer-exposing a pattern, defined on a reticle, to a sensitive substrate. The transfer-exposure is performed under a condition including a subatmospheric pressure. An embodiment of such a system comprises a vacuum chamber in which the reticle is placed for exposure, and a reticle-storage chamber in communication with the vacuum chamber. The reticle-storage chamber and vacuum chamber collectively form a subatmospheric-pressure enclosure. The reticle-storage chamber comprises a rack configured to hold multiple reticles at the subatmospheric pressure.

The system further can comprise a reticle stage located in the vacuum chamber, and a vacuum-side transport robot situated and configured to convey a reticle from the rack to the reticle stage or from the reticle stage to the rack. The multiple reticles can be held in at least one reticle cassette placed on the rack. In such a configuration the reticles in the reticle cassette desirably are accessible by the robot for loading and unloading of reticles directly to and from, respectively, the cassette without having to provide or actuate a gate valve or analogous appliance between the vacuum chamber and the reticle-storage chamber.

Desirably, the rack is temperature-controlled, preferably in a manner by which the temperature of one or more reticles is changed and/or maintained at a desired value by conduction (for rapid attainment of a desired reticle temperature). To such end, the rack portion contacting a reticle directly or indirectly desirably comprises a hydraulic conduit through which a temperature-controlled fluid is circulated.

The system further can comprise a load-lock chamber coupled to the reticle-storage chamber and configured for passage of a reticle from a higher-pressure environment to the reticle-storage chamber containing the subatmospheric pressure. This system further can comprise an atmospheric-pressure reticle "library" (assortment of one or more selectable reticles) situated so as to allow transfer of a reticle from the atmospheric-pressure reticle library to the load-lock chamber.

The system further can comprise an atmosphere-side transport robot situated between the atmospheric-pressure reticle library and the load-lock chamber and configured to convey a reticle between the atmospheric-pressure reticle library and the load-lock chamber. The atmospheric-pressure reticle library can comprise a rack comprising multiple shelves each configured to hold at least one respective reticle cassette.

The reticles and respective cassettes desirably bear respective identification symbols, wherein the system further comprises an identification-symbol reader situated and configured to read the respective identification symbols of a selected reticle and its respective cassette, and to confirm that the reticle is placed in its correct respective cassette. For example, the identification symbol is a bar code, and the identification-symbol reader is a bar-code reader. This system desirably further comprises an atmosphere-side transport robot situated between the atmospheric-pressure reticle library and the load-lock chamber. The atmosphere-side transport robot is configured to convey a reticle between the atmospheric-pressure reticle library and the load-lock chamber and to return the reticle to its respective cassette as determined by the identification-symbol reader.

Another system embodiment comprises a vacuum chamber in which the reticle is placed for exposure, and multiple load-lock chambers coupled in parallel with the vacuum chamber. The load-lock chambers selectively are evacuated to the subatmospheric pressure and selectively brought into communication with the vacuum chamber (e.g., by opening a respective gate valve connecting the load-lock chamber to the vacuum chamber). Each load-lock chamber is configured to store at least one respective reticle, wherein the reticles are selectable for use in making a microlithographic exposure. Each load-lock chamber can contain a respective reticle cassette each configured to hold one or more respective reticles from which a desired reticle can be selected.

Another aspect of the invention is set forth in the context of a microlithographic method in which a pattern, defined on a reticle, is transfer-exposed using an energy beam that passes, in a subatmospheric pressure environment in a vacuum chamber, from the reticle to a sensitive substrate. The aspect is directed to methods for providing and introducing a reticle to the vacuum chamber for use in making a lithographic exposure. An embodiment of the method comprises the step of coupling a reticle-storage chamber directly to the vacuum chamber. (Thus, the vacuum chamber and reticle-storage chamber can be evacuated to the subatmospheric pressure.) The method also comprises the steps of storing multiple reticles, that are selectable for exposure, in the reticle-storage chamber; selecting a reticle in the reticle-storage chamber; and conveying (e.g., using a vacuum-side transport robot) the selected reticle directly from the reticle-storage chamber to the vacuum chamber (e.g., to a reticle stage) for exposure. This conveyance is "direct" because it does not involve providing and/or actuating a gate valve between the reticle-storage chamber and the vacuum chamber. (A gate valve can be situated in this location for maintenance purposes. However, if present in this embodiment, the gate valve normally need not be actuated during transfer of reticles between the reticle-storage chamber and the vacuum chamber.)

The reticles desirably are stored on a rack inside the reticle-storage chamber. The reticles further desirably are held in at least one reticle cassette placed on the rack. The conveying step can be performed using a vacuum-side transport robot, wherein the reticles in the reticle cassette are accessible by the robot for loading and unloading of reticles to and from, respectively, the cassette.

The method further can comprise the step of controlling the temperature of the reticles stored in the reticle-storage chamber. In such a method the temperature-controlled reticles desirably are stored on at least one shelf of a rack located inside the reticle-storage chamber, and the temperature of the reticles is controlled by, e.g., circulating a temperature-controlled fluid through a conduit in the shelf. Thus, the temperature of the reticle(s) is controlled by conduction from the shelf to the reticle, which produces the desired reticle temperature by conduction.

The method further can comprise the step of moving at least one reticle from a higher-pressure environment to the reticle-storage chamber. In such a method a reticle in an atmospheric-pressure reticle library is selected for use and conveyed from the atmospheric-pressure reticle library to the reticle-storage chamber. Selecting the reticle in the atmospheric-pressure reticle library desirably involves reading an identification symbol on the reticle. This reading step can be performed while the reticle is situated in the atmospheric-pressure reticle library, after the reticle has been removed from the atmospheric-pressure reticle library, and/or before the reticle is placed in the atmospheric-pressure reticle library. Furthermore, if the reticles are stored on a rack inside the reticle-storage chamber, the reticles can be held in at least one reticle cassette placed on the rack, and the reading step further can comprise reading an identification symbol (e.g., bar code) associated with the reticle cassette containing the selected reticle.

In another method embodiment, multiple load-lock chambers are coupled in parallel to the vacuum chamber so as to allow the load-lock chambers selectively to be brought into communication with the vacuum chamber. At least one respective reticle, selectable for exposure, is stored in each of the load-lock chambers. A reticle, located in one of the load-lock chambers, is selected for exposure, and the selected reticle is conveyed to the vacuum chamber for exposure. Each load-lock chamber desirably contains a reticle cassette each configured to hold multiple respective reticles, wherein the conveying step desirably comprises removing the selected reticle from the respective reticle cassette.

The foregoing and additional features and advantages of the invention will be more readily apparent from the following detailed description, which proceeds with reference to the accompanying drawings.

DETAILED DESCRIPTION

The invention is described below in the context of representative embodiments that are not intended to be limiting in any way.

Figure 4:
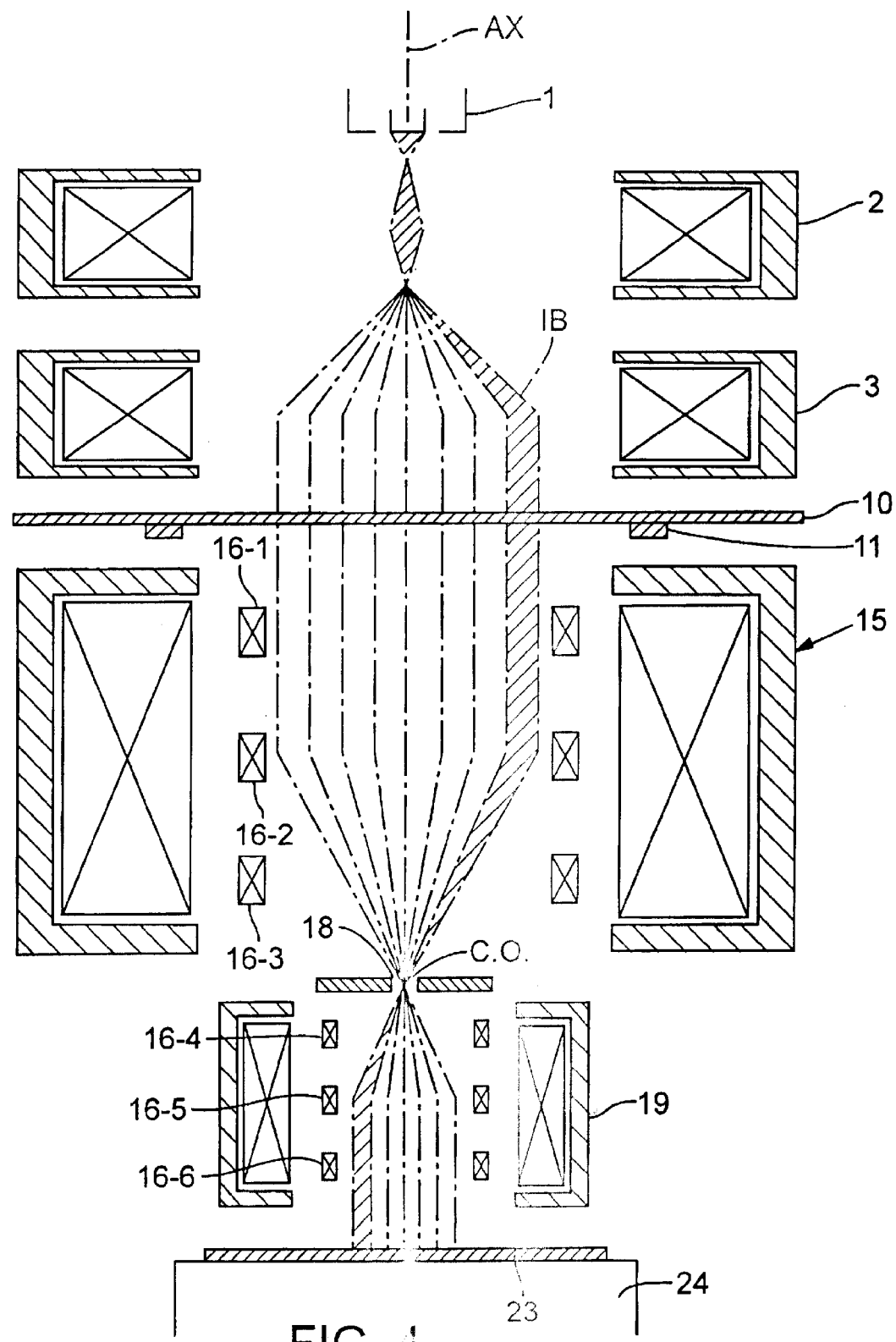
FIG. 4 is a schematic elevational view of a representative embodiment of an electron-beam microlithography system of the step-and-repeat type that can include load-lock chambers and reticle cassettes as described herein.
Figure 5:
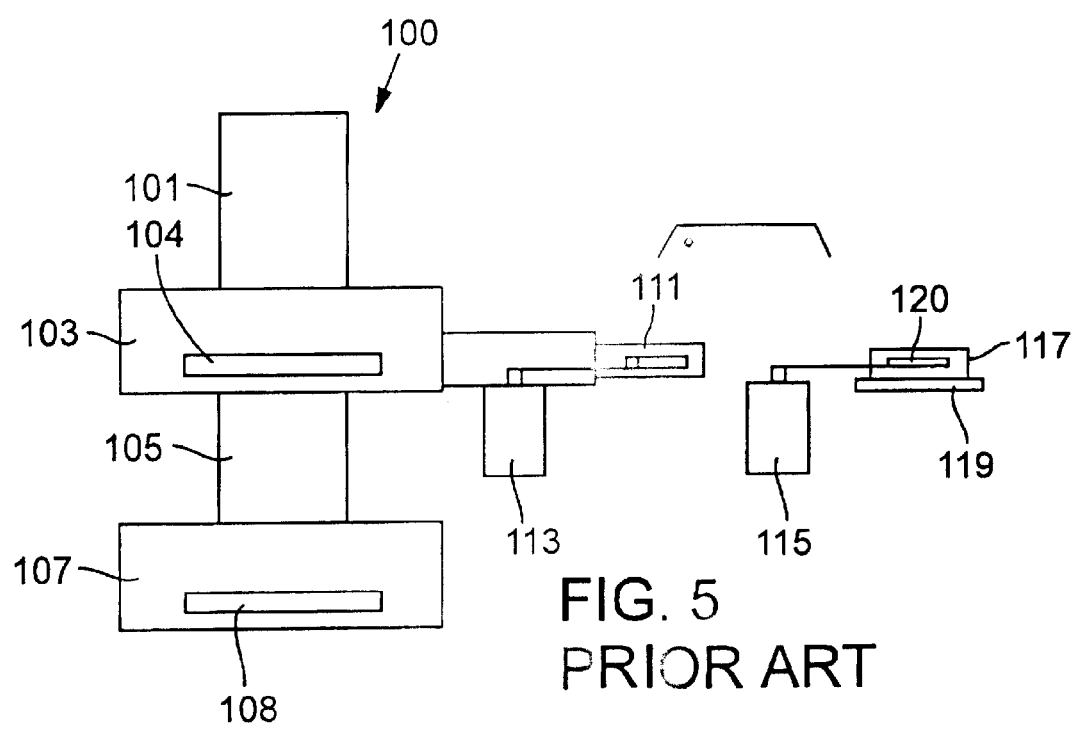
FIG. 5 is a schematic elevational view of a conventional microlithography system including a conventional load-lock chamber.

First, the overall structure of an electron-beam microlithography system, as well as the general optical relationships of such a system, are depicted schematically in FIG. 4. The particular type of system depicted in FIG. 4 is a step-and-repeat type as known in the art, and the system is configured for use with load-lock chambers (and other peripherals) as described later below.

An electron gun 1 is situated at the extreme upstream end of the system and generates an electron beam that propagates in a downstream direction (downward in the figure). The electron beam propagates in a generally axial direction through an illumination-optical system comprising a condenser lens 2 and an illumination lens 3. The illumination-optical system shapes and directs the beam (termed an "illumination beam" IB) onto a selected region of the reticle 10. In addition to the lenses 2, 3, the illumination-optical system includes a beam-shaping aperture, a blanking deflector, a blanking aperture, an illumination-beam deflector, etc. (not detailed). The illumination beam IB, formed by the illumination-optical system, is moved in a scanning manner across successive regions of the reticle 10, thereby illuminating exposure regions ("subfields") of the reticle 10, situated in the optical field of the illumination-optical system, in a sequential manner.

As noted above, the reticle 10 defines a large number of exposure regions termed "subfields" each defining a respective portion of the overall pattern defined on the reticle. For exposure the reticle is mounted on a movable reticle stage 11. Moving the reticle stage 11 in a plane perpendicular to the optical axis AX allows the subfields of the reticle to be illuminated selectively in a sequential manner. This exposure scheme is termed "divided-reticle" exposure and effectively achieves exposure of an entire pattern that covers a much greater area than the optical field of the illumination-optical system.

Situated downstream of the reticle 10 is a projection-optical system comprising a first projection lens 15, a second projection lens 19, and deflectors 16-1 to 16-6, the latter being used for aberration correction and image-position adjustment. The electron beam passing through a selected subfield of the reticle 10 is focused by the projection-optical system at a predetermined position on a sensitive substrate 23 (e.g., semiconductor wafer). So as to be imprinted with the projected image, the substrate 23 is coated with a material termed a "resist" that is sensitive to an exposure dose by the electron beam. Typically, the projection-optical system is a "reducing" system, by which is meant that the image as formed on the substrate 23 is smaller, usually by a factor termed a "demagnification factor" (e.g., ¼), than the corresponding pattern as defined on the reticle 10.

The electron beam forms a crossover C.O. at a point having an axial location, between the reticle 10 and substrate 23, that is determined by the demagnification ratio. A contrast aperture 18 is situated at the crossover. The contrast aperture 18 blocks electrons of the beam that were scattered by passage through non-patterned regions of the reticle 10, thereby preventing the scattered electrons from reaching the substrate 23.

The substrate 23 is mounted via an electrostatic chuck (not shown) to a substrate stage 24 that is movable in the XY direction. Each portion of a device pattern, extending wider than the optical field of the projection-optical system, can be exposed in a sequential manner by synchronously scanning the reticle stage 11 and substrate stage 24 in opposite directions.

Figure 1A:
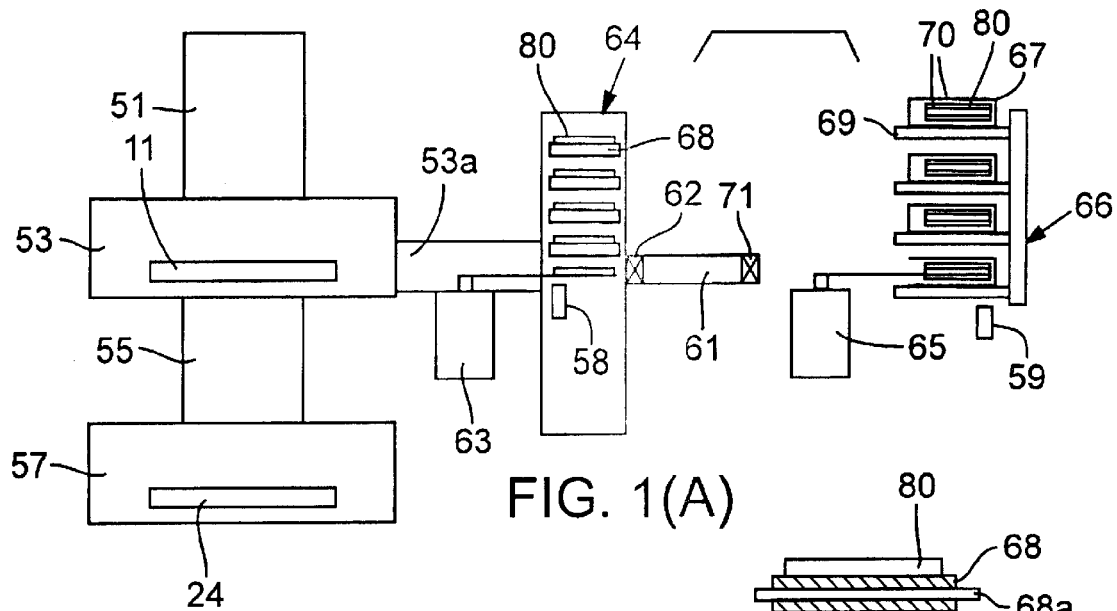
FIG. 1(A) is a schematic elevational view of a first representative embodiment of a microlithography system including an "atmospheric-pressure" reticle library and a "vacuum" reticle library.
Figure 1B:
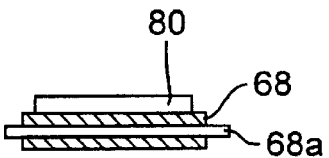
FIG. 1(B) is an enlarged schematic elevational view of a temperature-controlled rack used in the vacuum reticle library of the system shown in FIG. 1(A).

FIG. 1(A) schematically depicts the structure of a microlithography system according to a first representative embodiment. FIG. 1(B) depicts detail of a region of a rack 66 used for storing (under vacuum) a reticle library for the microlithography system. The system shown in FIG. 1(A) comprises an illumination-optical system (IOS) lens column 51 that contains the electron gun 1, condenser lens 2, illumination lens 3, etc., summarized above with reference to FIG. 4. Downstream of the IOS lens column 51 is a reticle chamber 53 that contains a reticle stage 11. Downstream of the reticle chamber 53 is a projection-optical system (POS) lens column 55 that contains the first projection lens 15, second projection lens 19, deflectors 16, etc., summarized above with reference to FIG. 4. Downstream of the POS lens column 55 is a wafer chamber 57 that contains a wafer stage 24. These columns 51, 55 and chambers 53, 57 are not necessarily separate, individual chambers; one or more of them can be contiguous with each other. The columns 51, 55 and chambers 53, 57 can be evacuated by one or more vacuum pumps (not shown but well-understood in the art) configured to evacuate respective individual columns and chambers or multiple columns and/or chambers.

A vacuum-side transport robot 63 is situated in a right-hand (in the figure) extension 53a of the reticle chamber 53. A vacuum reticle library 64 and reticle load-lock chamber 61 are connected to the extension 53a to the right (in the figure) of the robot 63. The vacuum reticle library 64 is effectively a chamber containing an array of reticles 80 stored in a vacuum environment. A first gate valve 62 is interposed between the vacuum reticle library 64 and the reticle load-lock chamber 61. A second gate valve 71 is provided at the entrance to the reticle load-lock chamber 61. Inside the vacuum reticle library 64 is a rack 68 having, e.g., multiple shelves (four are shown) that support respective reticles 80 placed on them. In any event, the rack 68 is configured to hold multiple reticles 80.

The rack 68 desirably is temperature-controlled, preferably in a manner by which thermal exchange with one or more reticles 80 is by thermal conduction, which is rapid and efficient. To such end, as shown in FIG. 1(B), at least one shelf of the rack 68 includes a respective fluid conduit 68a connected to a fluid of which the temperature is controlled. The fluid circulates through the conduits 68a. An exemplary temperature-control fluid is water. Thus, the vacuum reticle library 64 is configured to regulate the temperature of reticles 80 on the rack 68 by thermal conduction from the fluid to the reticles. The circulating fluid achieves rapid equilibration of the reticles 80 at the desired reticle temperature. In this manner, the temperature of a reticle 80 (that has experienced a temperature change when placed in the vacuum environment and/or that is destined for immediate use in making an exposure) placed on a shelf of the rack 68 can be stabilized quickly to a desired temperature. For example, the temperature of a reticle increases not only from being transported to a vacuum environment but also from being irradiated during use in lithographic exposure. This temperature increase can be predicted, and the temperature of the temperature-control fluid can be set accordingly so as to confer the predicted temperature to the reticles. The temperature of each shelf of the rack 68 need not be identical from shelf to shelf. Rather, the temperature of each shelf can be variable as desired.

An atmospheric-pressure reticle library 66 is situated to the right (in the figure) of the reticle load-lock chamber 61, with an atmosphere-side transport robot 65 interposed therebetween. A rack 69 having multiple shelves (four are shown) is provided in the atmospheric-pressure reticle library 66 so as to provide multiple reticles 80 that can be selected quickly for exposure. Each shelf supports a respective reticle cassette 67. Multiple reticles 80 (which can be the same or different) desirably are stored in each reticle cassette 67 (or each cassette can hold as few as one reticle). To identify the contents of each cassette 67, a respective bar code (as an exemplary identification symbol) 70 is applied to the cassette 67 and to each reticle 80 situated in the cassette 67.

In the context of using a bar code as a representative identification symbol, when transporting a reticle 80 to and from the atmospheric-pressure reticle library 66, the respective bar code 70 on the reticle 80 and cassette 67 is read by a bar-code reader 59 so as to confirm that the proper reticle from the proper cassette is being transported. Since specific reticles 80 are stored in specific reticle cassettes 67, each particular reticle desirably is returned to its original reticle cassette after use of the reticle. To ensure no mixups in this regard, the respective bar codes 70 of the reticle 80 and of the reticle cassette 67 are read and confirmed. After making such confirmation is the reticle returned to its cassette. By thus reading the bar code 70 and confirming the identity of the reticle 80, the reticle is returned to its original reticle cassette without error. The bar codes 70 on the reticle 80 and reticle cassette 67 desirably are read in advance of reticle selection, wherein the read data are stored in a memory and recalled during the confirmation step.

In other words, reticles desirably remain "paired" with their respective reticle cassettes, wherein, after a reticle is used for exposure it desirably is returned to its original cassette 67 (i.e., the cassette in which the reticle was stored prior to use). Upon reading and confirming the bar codes 70 on reticles 80 and cassettes 67, the reticle is returned reliably to its proper cassette.

In FIG. 1(A) the reticle libraries 64, 66 are configured desirably for vertical stacking of reticles 80 on a respective stationary rack. Alternatively, it is possible for the reticle libraries to be configured for use with a vertically movable transport robot or such that the reticle libraries 64, 66 themselves move vertically.

Whenever a reticle 80 is being transported between the vacuum reticle library 64 and the atmospheric-pressure reticle library 66, the operator can provide appropriate commands from a keyboard console or the like (not shown), or may operate appropriate controls (not shown) provided at or near the atmospheric-pressure reticle library 66. If necessary, the bar code 70 applied to the reticle 80 can be read by a bar-code reader 58.

Pre-alignment of the reticle may be necessary until the reticle is transported onto the reticle stage 11. This pre-alignment may be accomplished while transporting the reticle from the atmospheric-pressure reticle library 66 to the load-lock chamber 61, before placing the reticle in the vacuum reticle library 64, or while performing both operations.

Figure 2:
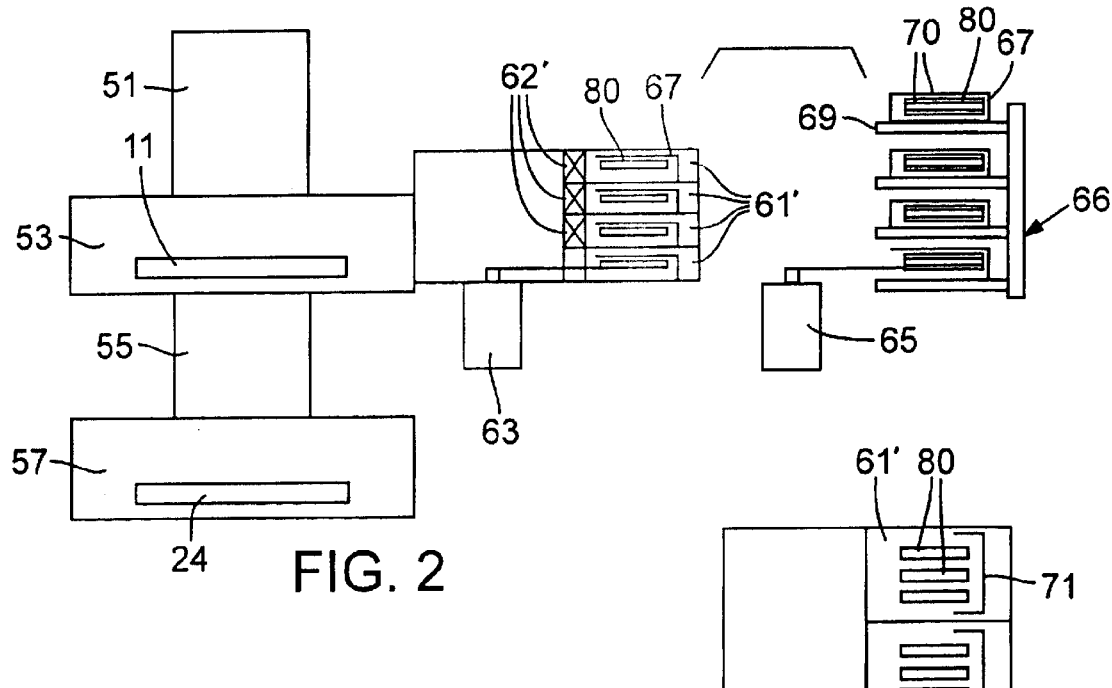
FIG. 2 is a schematic elevational view of a second representative embodiment of a microlithography system including an atmospheric-pressure reticle library and a vacuum reticle library.
Figure 3:
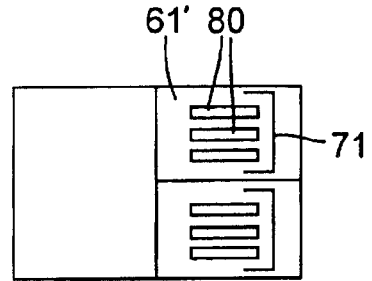
FIG. 3 is a schematic elevational view of the load-lock chamber of the embodiment of FIG. 2, showing a rack holding multiple reticle cassettes each capable of holding multiple respective reticles.

A second representative embodiment is depicted in FIG. 2, and FIG. 3 depicts an example of a load-lock chamber used with this embodiment. The microlithography system shown in FIG. 2 comprises multiple load-lock chambers 61' instead of the vacuum reticle library 64 used in the first representative embodiment, coupled in parallel to the vacuum chamber 53. Each load-lock chamber 61' contains one or more respective reticles 80. The operator selects whether the interior of each load-lock chamber 61' is atmospheric pressure or vacuum, or a desired intermediate pressure. Each load-lock chamber 61' can be brought selectively into communication with the vacuum chamber 53 by, e.g., opening a respective gate valve 62'. The use of multiple load-lock chambers 61' arranged in this manner facilitates rapid and efficient movement of reticles 80 between the atmosphere side and the vacuum side. As shown in FIG. 3, a respective cassette 67 capable of holding one or more reticles 80 can be situated inside each load-lock chamber 61'.

Reticle cassettes conventionally are made of a rigid plastic resin. If a reticle cassette is moved from an atmospheric-pressure environment to a vacuum environment, the resin tends to outgas, which can degrade the vacuum level. By storing the reticle cassettes 67 in the vacuum environment of the respective load-lock chambers 61', outgassing proceeds and eventually is reduced substantially, thereby avoiding vacuum deterioration. Also, since multiple reticles 80 collectively are stored in the load-lock chambers 61', it is unnecessary to perform outgassing evacuation each time a reticle is exchanged.

Therefore, according to the embodiments described above, methods and devices are provided that provide easy reticle exchange as well as temperature control of the reticles, if desired.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. A microlithography system for transfer-exposing a pattern, defined on a reticle, to a sensitive substrate under a condition including a subatmospheric pressure, the system comprising:

a vacuum chamber in which the reticle is placed for exposure; and a reticle-storage chamber in communication with the vacuum chamber, the reticle-storage chamber and vacuum chamber collectively forming a subatmospheric-pressure enclosure, and the reticle-storage chamber comprising a temperature-controlled rack configured to hold multiple reticles at the subatmospheric pressure.

2. The system of claim 1, further comprising;

a reticle stage located in the vacuum chamber; and a vacuum-side transport robot situated and configured to convey a reticle from the rack to the reticle stage or from the reticle stage to the rack.

3. The system of claim 2, wherein:

the multiple reticles are held in at least one reticle cassette placed on the rack; and the reticles in the reticle cassette are accessible by the robot for loading and unloading of reticles to and from, respectively, the cassette.

4. The system of claim 1, wherein the rack comprises a hydraulic conduit through which a temperature-controlled fluid is circulated.

5. The system of claim 1, further comprising a load-lock chamber coupled to the reticle-storage chamber and configured for passage of a reticle from a higher-pressure environment to the reticle-storage chamber containing the subatmospheric pressure.

6. The system of claim 5, further comprising an atmospheric-pressure reticle library situated so as to allow transfer of a reticle from the atmospheric-pressure reticle library to the load-lock chamber.

7. The system of claim 6, further comprising an atmosphere-side transport robot situated between the atmospheric-pressure reticle library and the load-lock chamber and configured to convey a reticle between the atmospheric-pressure reticle library and the load-lock chamber.

8. The system of claim 6, wherein the atmospheric-pressure reticle library comprises a rack comprising multiple shelves each configured to hold at least one respective reticle cassette.

9. The system of claim 8, wherein:
the reticles and respective cassettes bear respective identification symbols; and
the system further comprises an identification-symbol reader situated and configured to read the respective identification symbols of a selected reticle and its respective cassette, and to confirm that the reticle is placed in its correct respective cassette.

10. The system of claim 9, wherein:
the identification symbol is a bar code; and
the identification-symbol reader is a bar-code reader.

11. The system of claim 9, further comprising an atmosphere-side transport robot situated between the atmospheric-pressure reticle library and the load-lock chamber and configured to convey a reticle between the atmospheric-pressure reticle library and the load-lock chamber and to return the reticle to its respective cassette as determined by the identification-symbol reader.

12. A microlithography system for transfer-exposing a pattern, defined on a reticle, to a sensitive substrate in a subatmospheric pressure, comprising:
a vacuum chamber in which the reticle is placed for exposure; and
multiple load-lock chambers coupled in parallel with the vacuum chamber so as to be evacuated selectively to the subatmospheric pressure and selectively brought into communication with the vacuum chamber, each load-lock chamber being configured to store at least one respective reticle at a respective controlled temperature, the reticles being selectable for use in making a microlithographic exposure.

13. The system of claim 12, wherein each load-lock chamber contains a respective reticle cassette each configured to hold multiple respective reticles.

14. In a microlithographic method in which a pattern, defined on a reticle, is transfer-exposed using an energy beam that passes, in a subatmospheric pressure environment in a vacuum chamber, from the reticle to a sensitive substrate, a method for providing and introducing a reticle to the vacuum chamber for use in making a lithographic exposure, the method comprising:
coupling a reticle-storage chamber directly to the vacuum chamber;
storing multiple reticles, that are selectable for exposure, in the reticle-storage chamber while controlling the temperature of one or more of the reticles stored in the reticle-storage chamber;
selecting a reticle in the reticle-storage chamber; and
conveying the selected reticle directly from the reticle-storage chamber to the vacuum chamber for exposure.

15. The method of claim 14, wherein the conveying step is performed using a vacuum-side transport robot.

16. The method of claim 14, wherein the selected reticle is conveyed to a reticle stage for exposure.

17. The method of claim 14, wherein:
the reticles are stored on a rack inside the reticle-storage chamber; and
in the storing step, the reticles are held in at least one reticle cassette placed on the rack.

18. The method of claim 17, wherein:
the conveying step is performed using a vacuum-side transport robot; and
the reticles in the reticle cassette are accessible by the robot for loading and unloading of reticles to and from, respectively, the cassette.

19. The method of claim 14, wherein:
the temperature-controlled reticle is stored on a shelf of a rack located inside the reticle-storage chamber; and
the step of controlling the temperature of the reticle comprises circulating a temperature-controlled fluid through a conduit in the shelf.

20. The method of claim 14, further comprising the step of moving at least one reticle from a higher-pressure environment to the reticle-storage chamber.

21. The method of claim 20, wherein the moving step comprises:
selecting a reticle situated in an atmospheric-pressure reticle library; and
conveying the selected reticle from the atmospheric-pressure reticle library to the reticle-storage chamber.

22. The method of claim 21, wherein the step of selecting the reticle in the atmospheric-pressure reticle library comprises reading an identification symbol on the reticle while the reticle is situated in the atmospheric-pressure reticle library or while the reticle is removed from the atmospheric-pressure reticle library.

23. The method of claim 22, wherein:
the reticles are stored on a rack inside the reticle-storage chamber;
in the storing step, the reticles are held in at least one reticle cassette placed on the rack; and
the reading step further comprises reading an identification symbol associated with the reticle cassette containing the selected reticle.

24. The method of claim 20, wherein:
the reticles are stored on a rack inside the reticle-storage chamber; and
in the storing step, the reticles are held in at least one reticle cassette placed on the rack.

25. In a microlithographic method in which a pattern, defined on a reticle, is transfer-exposed using an energy beam that passes, in a subatmospheric pressure environment in a vacuum chamber, from the reticle to a sensitive substrate, a method for providing and introducing a reticle to the vacuum chamber for exposure, the method comprising:
coupling multiple load-lock chambers in parallel to the vacuum chamber so as to allow the load-lock chambers selectively to be brought into communication with the vacuum chamber;
storing at least one respective reticle, selectable for exposure, in each of the load-lock chambers while controlling the temperature of the respective reticles in the respective load-lock chambers;
selecting a reticle, located in one of the load-lock chambers, for exposure; and
conveying the selected reticle to the vacuum chamber for use in making a lithographic exposure.

26. The method of claim 25, wherein:
each load-lock chamber contains a reticle cassette each configured to hold multiple respective reticles; and
the conveying step comprises removing the selected reticle from the respective reticle cassette.

* * * * *